United States Patent [19]

Otofuji

[11] 4,195,240
[45] Mar. 25, 1980

[54] VOLTAGE COMPARATOR CIRCUIT HAVING DEAD ZONE

[75] Inventor: Kiyoshi Otofuji, Kodaira, Japan

[73] Assignee: Hitachi Denshi Kabushiki Kaisha, Japan

[21] Appl. No.: 849,791

[22] Filed: Nov. 9, 1977

[30] Foreign Application Priority Data

Jun. 3, 1977 [JP] Japan .................................. 52-64686

[51] Int. Cl.² ........................................... H03K 5/153
[52] U.S. Cl. ..................................... 307/362; 307/291
[58] Field of Search ............... 307/228, 262, 354, 362, 307/363, 291, DIG. 1; 315/5.24, 364

[56] References Cited

U.S. PATENT DOCUMENTS

| 3,054,910 | 9/1962 | Bothwell | 307/362 |
| 3,256,449 | 6/1966 | Scholl | 307/291 |

*Primary Examiner*—John Zazworsky
*Attorney, Agent, or Firm*—Craig and Antonelli

[57] ABSTRACT

Disclosed is a voltage comparator circuit in which an input voltage and a predetermined reference voltage are compared by a differential amplifier to produce a signal corresponding to the difference between both the voltages. The width of a dead zone of the comparator circuit is established by an emitter-grounded transistor connected to the output of the differential amplifier, a polarity inverting IC gate connected to the collector of the emitter-grounded transistor, and a resistor which positive-feeds back the output of the IC gate to the base of the emitter-grounded transistor.

4 Claims, 2 Drawing Figures

VOLTAGE COMPARATOR CIRCUIT HAVING DEAD ZONE

FIELD OF THE INVENTION

The present invention relates to an improvement in a voltage comparator circuit such as a delayed trigger pick-off circuit used in an oscilloscope with a delayed sweep mode.

DESCRIPTION OF THE PRIOR ART

FIG. 1 shows a typical example of a conventional voltage comparator circuit as a delayed trigger pick-off circuit. Such circuits are widely used in oscilloscopes with a delayed sweep mode. A saw-tooth voltage generated by a delaying sweep circuit 1 and a reference voltage established by a variable resistor RV1 of a delay time multiplier (hereinafter referred to as DTM) are compared by transistors TR1 and TR2 which form a differential amplifier. The amplified signal is supplied to a tunnel diode D1. The tunnel diode D1 forms the width of a dead zone of the comparator circuit and shapes the waveform of the amplified signal. The shaped signal is differentiated by a capacitor C1 and then amplified by an amplifier 2 which in turn produces the differentiated and amplified signal at its output OUT. The output signal is called a "delayed trigger" pulse because it is generated after the time established by the DTM (i.e. the time for which the level of the saw-tooth voltage changes from its rise point to reach the level of the reference voltage). This circuit has a feature that it can produce a stable and accurate delayed trigger pulse even in a high speed sweep mode since the high-speed waveform-shaped operation of the tunnel diode is utilized.

However, the above-described circuit has to use the expensive tunnel diode, requires a constant current circuit including a transistor TR3 in order to extend the dynamic range of the voltage established by the DTM, and requires a large number of bias elements. Further, the amplifier 2 shown in FIG. 1 is needed since the signal level shaped by the tunnel diode is too low. Furthermore, a large bias current is required for the tunnel diode itself so that a large amount of power is consumed by the overall circuit.

Also, although the integrated circuit configuration of a main sweep circuit connected to the output of the trigger pick-off circuit is demanded and developed, the waveform-shaped output of the tunnel diode or the differentiated output is not suitable for the input of the IC. As a result, an additional circuit such as a level converting circuit is needed in order to convert the output level of the tunnel diode to an IC input level.

Therefore, it has been desired to develop a practical delayed trigger pick-off circuit which can be constructed with low cost, has a reduced number of circuit components and low power consumption, and can produce an output suitable for input to an IC level.

SUMMARY OF THE INVENTION

An object of the present invention is to provide a voltage comparator circuit in which the lowering of cost, the reduction of circuit components and the lowering of power consumption are realized by eliminating the tunnel diode, and other elements of conventional comparator circuits while realizing an IC configuration permitting interface with another IC.

According to the present invention, the width of the dead zone of the voltage comparator circuit is established by a dead zone forming circuit means including an emitter-grounded transistor whose base is connected to the output of the differential amplifier, a polarity inverting IC gate whose input is connected to the collector of the transistor, and a resistor which positive-feeds back the output of the IC gate to the base of the transistor.

DESCRIPTION OF THE PREFERRED EMBODIMENTS

Figure 2:
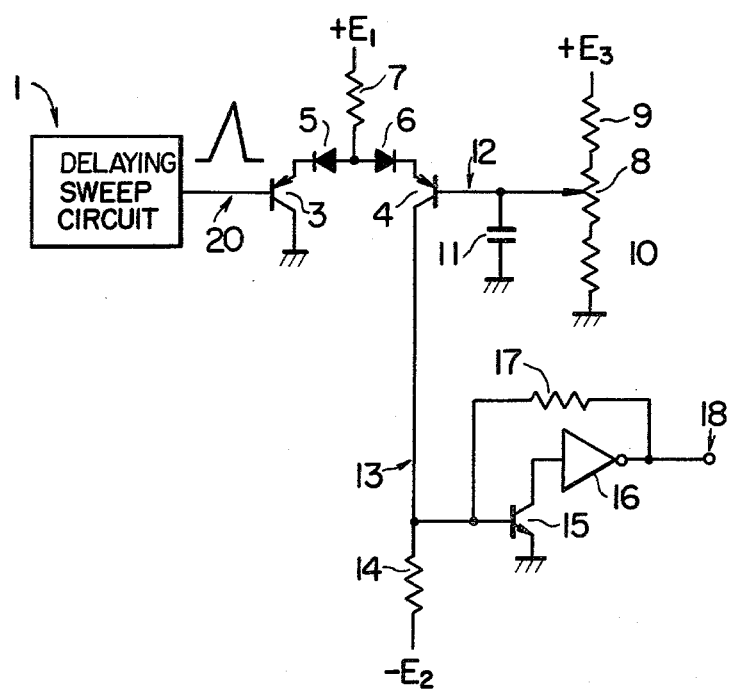
FIG. 2 shows a circuit diagram of the voltage comparator circuit according to an embodiment of the present invention.

In FIG. 2 showing a circuit diagram of the voltage comparator circuit according to an embodiment of the present invention applied as a delayed trigger pick-off circuit of an oscilloscope, reference numeral 1 represents a delaying sweep circuit, numeral 20 a saw-tooth output of the delaying sweep circuit 1, numerals 3 and 4 transistors, numerals 5 and 6 diodes, numeral 7 a resistor, numeral 8 a variable resistor of the DTM, numerals 9 and 10 bleeder resistors for establishing a variable range of the DTM, numeral 11 a bypass capacitor, numeral 12 a predetermined reference voltage established by the resistor 8 of the DTM, numeral 13 the collector voltage of the transistor 4, numeral 14 a bias resistor, numeral 15 an emitter-grounded transistor, numeral 16 an inverter gate made in an IC configuration (hereinafter referred to simply as IC gate), numeral 17 a resistor, and numeral 18 a delayed trigger output. The collector of the transistor 4 is directly connected to the base of the emitter-grounded transistor 15. The collector of the transistor 15 is, in turn, connected to the input of the IC gate 16 whose output is connected to the trigger output terminal 18. The output of the IC gate 16 is also connected to the base of the transistor 15 through the positive feedback resistor 17.

In operation, a predetermined voltage level of the saw-tooth output 20 from the delaying sweep circuit 1 is detected through the comparison with the reference voltage 12 established by the DTM so that a delayed trigger pulse is generated after the time for which the saw-tooth voltage changes from its rise point to reach the predetermined level.

The transistors 3 and 4 form a differential amplifier for voltage comparison and detection. The diodes 5 and 6, series-connected with their conducting directions opposite to each other, serve as a protection means against reverse breakdown voltages between the bases and emitters of the transistors 3 and 4. The resistor 7 connected to the junction point of the diodes 5 and 6 provides an approximately constant bias current from a high power source $+E_1$.

The collector current of the transistor 3 begins to decrease when the level of the saw-tooth voltage reaches the level of the reference voltage established by the resistor 8 of the DTM. At this time, on the other hand, the collector voltage 13 of the transistor 4 increases. Thus, the collector voltage 13 of the transistor 4 changes from negative to positive to turn the transistor 15 on so that the input of the IC gate 16 changes from its high level to its low level, thereby inverting the output 18 from its low level to its high level. At this time, a positive feedback loop including the resistor 17 functions to jump this inverting operation at high speed. In such a manner, the width of the dead zone required for the comparator operation is formed. As a result, a high speed stepwise delayed trigger pulse having an IC input level is generated at the output 18 after the delay time established by the DTM.

The above-described voltage comparator circuit according to the embodiment of the present invention has many excellent features as follows.

One feature is that the emitter-grounded transistor 15 has two functions. A first function is to improve the gain of the positive feedback loop for forming the dead zone in cooperation with the IC gate 16. Therefore, a stable dead zone width can be obtained and a high speed delayed trigger pulse can be generated by a small drive current for the base of the transistor 15. In other words, the error component of the base drive current evaluated in terms of the saw-tooth voltage from the delaying sweep circuit 1 becomes almost negligibly small and the transistor 15 can follow up even a high speed saw-tooth signal with high speed since the transistor 15 is connected in the direction of turn-on. As a result, the delayed trigger pulse can be faithfully generated after the delay time established by the DTM, thereby providing a considerably high speed and accurate operation in comparison with the conventional circuit using the tunnel diode as shown in FIG. 1.

The second function of the emitter-grounded transistor 15 is that the base of the transistor 15 itself clamps the collector voltage of the transistor 4 without raising that beyond the base-emitter voltage of the transistor 15. If this clamping function does not exist and in the case where the voltage established by the DTM and supplied to the base of the transistor 4 is very low, the bias current flowing through the resistor 7 would flow entirely into the transistor 4 to raise the collector voltage 13 thereof to saturate the transistor 4. An excess current at the saturated state of the transistor 4 would charge the capacitor 11. The charged voltage would be superimposed on the voltage accurately established by the DTM, thereby providing a factor of an erroneous operation. Therefore, the clamping function of the emitter-grounded transistor 15 effectively provides a means for extending the active range of the transistor 4, i.e. the dynamic range of the voltage established by the DTM, so that the constant current circuit means of the conventional comparator circuit including the transistor TR3 as shown in FIG. 1 is eliminated.

Figure 1:
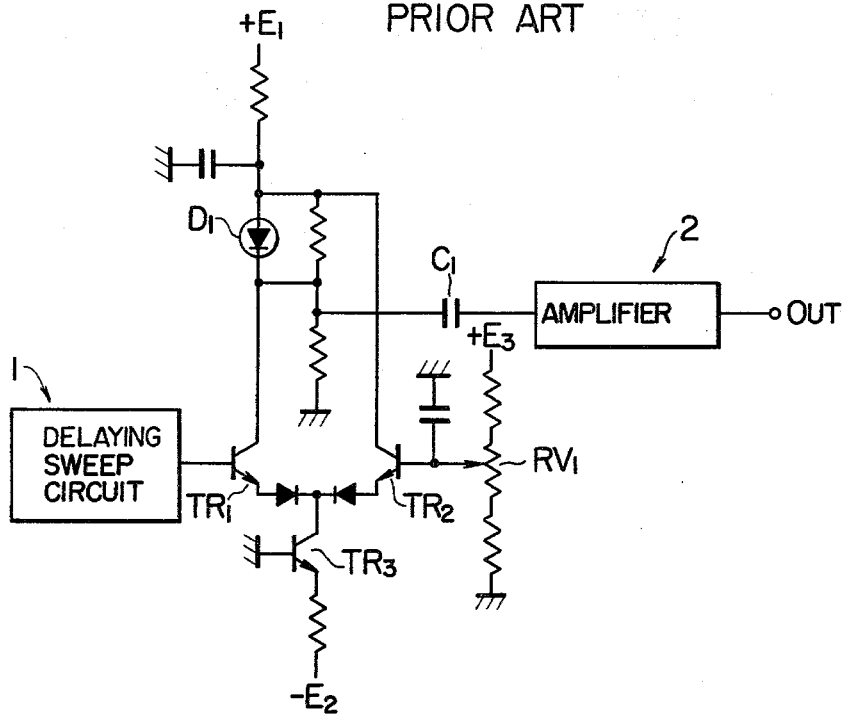
FIG. 1 shows a circuit diagram of the conventional voltage comparator circuit.

Another feature of the voltage comparator circuit according to the present invention is that the dead zone width can be freely selected by the value of the resistor 17 whereas in the conventional voltage comparator circuit shown in FIG. 1 the dead zone width is fixedly determined by the inherent parameter or negative current of the tunnel diode itself. The dead zone width can be selected even to the minimum level depending upon the quantity of the circuit noises, so that the delayed trigger pulse can be picked off more accurately in comparison with the conventional voltage comparator circuit. Further, the minimization of the dead zone width allows the decrease of the gains of the transistors 3 and 4 so that the bias current of the resistance 7 determining those gains can be decreased, thereby permitting a considerable lowering of power consumption.

The other features of the voltage comparator circuit according to the present invention include the fact that the IC gate 16 has a function of converting the output or delayed trigger pulse to the IC input level as well as a function of an amplifier element in the positive feedback loop for forming the dead zone width. Therefore, there are the advantages that the complicated circuits such as the amplifier 2 shown in FIG. 1 and a level converting circuit are not necessary. Also, a differentiating circuit is not required since the edge of the stepwise delayed trigger pulse generated by the comparator circuit of the present invention has a function equivalent to the differentiation function of the differentiating circuit of FIG. 1 as a discrete component.

It should be understood that the embodiment of the present invention has been exemplarily described in conjunction with FIG. 2 but various changes or modifications are possible. For example, an active IC element such as a TTL, DTL, Schottky TTL and ECL can be used as the IC gate 16. The IC gate 16 is also not limited to IC inverter logic and any suitable polarity inverting IC such as a NOR, NAND, etc. may be used. Further, a load resistor may be properly connected to the collector of the emitter-grounded transistor 15, depending upon the operating conditions and the input conditions of the IC gate 16.

As described above, according to the present invention, the delayed trigger pick-off circuit is simplified by employing the IC configuration and eliminating the tunnel diode. As a result, the number of circuit components is considerably reduced, thereby permitting the lowering of cost, the miniaturization of the overall circuit, the lowering of power consumption and the improvement of reliability.

The present invention is widely applicable to a general voltage comparator circuit rather than being limited to the delay circuit of an oscilloscope.

I claim:

1. A voltage comparator circuit comprising:
   a differential amplifier for receiving a changing input voltage which rises from a minimum voltage level and a predetermined reference voltage to produce at its output a signal corresponding to the difference between both said voltages; and
   a dead zone forming circuit means including an emitter-grounded transistor whose base is connected directly to the output of said differential amplifier, a polarity inverting IC gate whose input is connected to the collector of said emitter-grounded transistor, and a resistor which positive-feeds back the output of said IC gate to the base of said emitter-grounded transistor, the resistance value of said resistor determining the width of the dead zone formed by the dead zone forming circuit, said IC gate producing an output signal after the time for which the level of said input voltage changes from its minimum voltage level to reach the level of said predetermined reference voltage.

2. A voltage comparator circuit according to claim 1, wherein said input voltage is a saw-tooth voltage generated from a delaying sweep circuit of an oscilloscope with a delayed sweep mode, said predetermined reference voltage is an established by a delay time multiplier of said oscilloscope, and the output signal of said IC gate is supplied to a main sweep circuit of said oscilloscope.

3. A voltage comparator circuit according to claim 1, wherein said differential amplifier includes a first transistor whose base is coupled to said input voltage and whose collector is grounded and a second transistor whose base is coupled to said predetermined reference voltage and whose collector is connected directly to the base of said emitter-grounded transistor in said dead zone forming circuit means, the emitters of said first and second transistors being connected to each other.

4. A voltage comparator circuit according to claim 3, wherein two diodes are series-connected with their conducting directions opposite to each other between the emitters of said first and second transistors, and a bias resistor connected to a predetermined bias voltage at its one end is connected to the junction point of said diodes.